(12) United States Patent
Lo Verde et al.

(10) Patent No.: US 6,627,982 B2
(45) Date of Patent: Sep. 30, 2003

(54) ELECTRIC CONNECTION STRUCTURE FOR ELECTRONIC POWER DEVICES, AND METHOD OF CONNECTION

(75) Inventors: Domenico Lo Verde, Catania (IT); Giuseppe Bruno, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/850,724

(22) Filed: May 7, 2001

(65) Prior Publication Data

US 2002/0070432 A1 Jun. 13, 2002

(30) Foreign Application Priority Data

May 8, 2000 (EP) .............................................. 00830337

(51) Int. Cl.$^7$ .............................................. H01L 21/44
(52) U.S. Cl. .................. 257/678; 257/666; 257/676; 257/690; 257/692; 257/782; 257/784; 257/783; 438/123; 438/617; 438/118
(58) Field of Search ................................ 257/678, 787, 257/790, 707, 709, 710, 717, 718, 719, 693, 696, 666, 672, 676, 690, 692, 782, 784; 438/124, 126, 127

(56) References Cited

U.S. PATENT DOCUMENTS

| 4,839,717 A | | 6/1989 | Phy et al. ........................ 357/74 |
|---|---|---|---|
| 5,365,108 A | * | 11/1994 | Anderson et al. ............ 257/678 |
| 5,371,411 A | | 12/1994 | Hara et al. .................... 257/775 |
| 5,920,119 A | * | 7/1999 | Tamba et al. ................. 257/718 |
| 5,945,692 A | * | 8/1999 | Yano et al. ................... 257/139 |
| 6,032,356 A | | 3/2000 | Eldridge et al. ............... 29/843 |
| 6,046,507 A | * | 4/2000 | Hatchard et al. ............ 257/790 |
| 6,127,716 A | * | 10/2000 | Morizuka et al. ............ 257/503 |
| 6,201,696 B1 | * | 3/2001 | Shimizu et al. ............. 361/704 |
| 6,313,520 B1 | * | 11/2001 | Yoshida et al. .............. 257/676 |
| 6,316,726 B1 | * | 11/2001 | Hidaka et al. .............. 174/52.2 |
| 6,353,258 B1 | * | 3/2002 | Inoue et al. .................. 257/723 |
| 6,396,127 B1 | * | 5/2002 | Munoz et al. ............... 257/666 |
| 2001/0036065 A1 | * | 11/2001 | Hirano et al. ................ 361/760 |
| 2002/0011350 A1 | * | 1/2002 | Kono .......................... 174/260 |

FOREIGN PATENT DOCUMENTS

| DE | 33 37 796 A1 | 4/1985 |
|---|---|---|
| GB | 2 244 376 A | 11/1991 |

* cited by examiner

Primary Examiner—Nathan J. Flynn
Assistant Examiner—Fazli Erdem
(74) Attorney, Agent, or Firm—Lisa K. Jorgenson; Harold H. Bennett, II; Seed IP Law Group PLLC

(57) ABSTRACT

On a semiconductor material body housing an electronic device a peripheral region of semiconductor material and at least one pad are initially formed. The peripheral region is connected to a first terminal of the electronic device and extends on at least one peripheral portion of the semiconductor material body. The pad is insulated from the semiconductor material body and is electrically connected to a second terminal of the electronic device. The semiconductor material body is fixed to a support body formed by a blank belonging to a reel. The pad is connected by a wire to an electrode formed by the blank. Next, a connection region is formed on the peripheral region and surrounds, at least partially, the semiconductor material body and the support body. The connection region is advantageously obtained by galvanic growth.

27 Claims, 2 Drawing Sheets

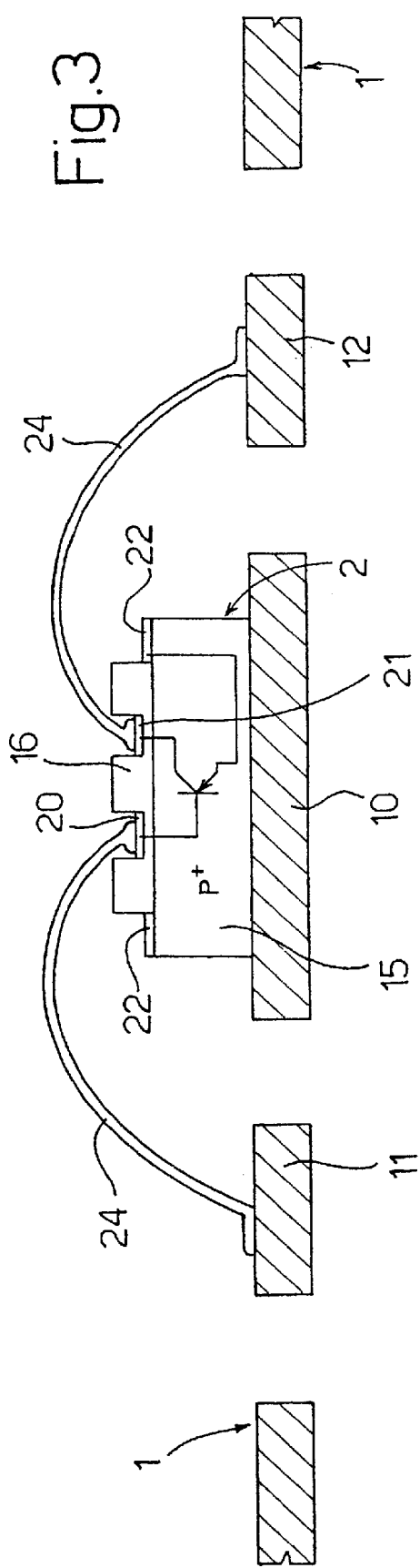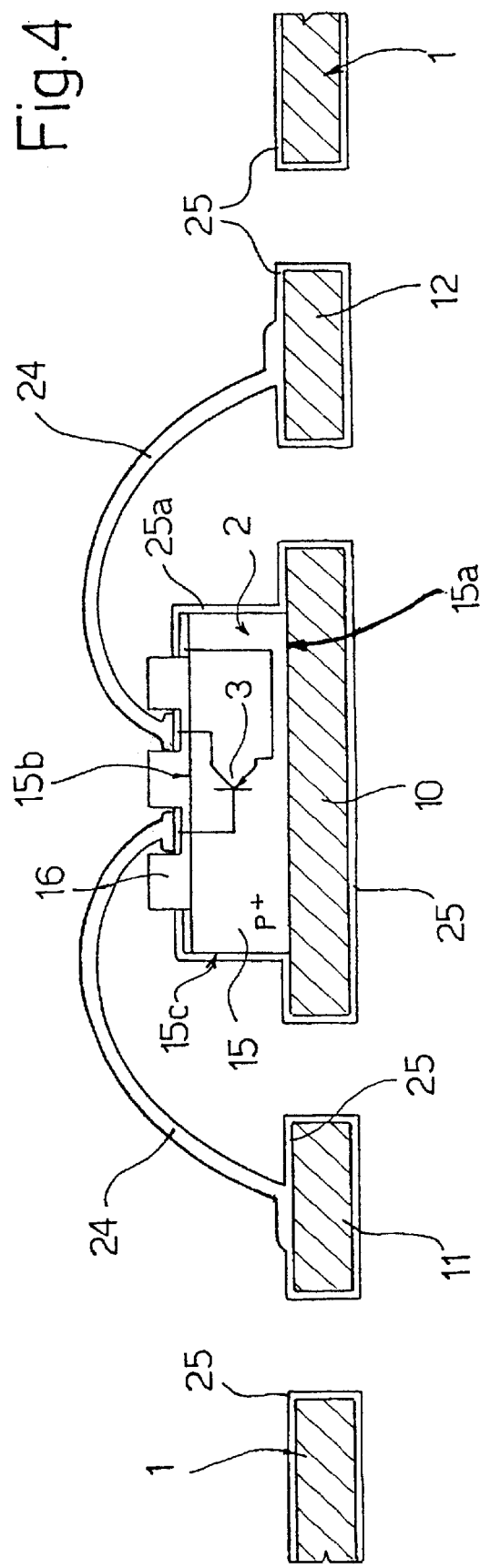

ELECTRIC CONNECTION STRUCTURE FOR ELECTRONIC POWER DEVICES, AND METHOD OF CONNECTION

TECHNICAL FIELD

The present invention regards an electric connection structure for electronic power devices, and a method of connection.

BACKGROUND OF THE INVENTION

As is known, bipolar or discrete MOS power devices (operating at powers of over 0.5 W) are required, which are fast (with cut-off frequencies higher than 20 GHz) and have operating frequencies typical of the "S band" (2–4 GHz). These devices are extensively used in the radio-frequency range, in particular in analog and digital telephones, in cordless telephones, radars, satellite television, and high-frequency oscillators.

In particular, elementary cells are required comprising BJT NPN or MOS transistors with a high integration level so as to be inserted in ever smaller packages. Thereby, it is possible to reduce the parasitic capacitances and inductances introduced by the package, which would reduce the performance of the device.

For these devices, the self-aligned double-polysilicon technology is widely used, which enables cut-off frequencies higher than 50 GHz to be reached. In these devices, the individual transistors are insulated by trenches filled with insulating material, so as to reduce the parasitic capacitance towards the substrate and to reduce the size of the BJT device, or through diffused regions around the active area. The emitter, base and collector contacts are generally provided on the front of the wafer, at pads, and are connected to the pins of the device by wire bonding.

Since these are power devices, and therefore pass strong currents, the electrical connections call for pads having a considerable area (at least 60×60 $\mu m^2$), and require the use of wires of large diameter (for example, 25.5 $\mu m$), thus increasing the size of the die integrating the device, in contrast with what would be desirable.

In the surface portion of the die of certain devices there is, moreover, the need to connect one of the terminals (collector, base, emitter, drain, source, or gate) to the substrate, so as to obtain a bottom-collector, bottom-base, bottom-emitter, bottom-drain, bottom-source, or bottom-gate. This connection may be made inside the die through a diffused region that extends from the surface to the bottom part of the die, or else externally through a wire that provides the electrical connection between the particular pad and the portion of the lead frame (hereinafter also called support region) on which the die is bonded, alongside the die. In this case, in order to prevent excessive bending of the connection wire (or connection wires if a multiple connection is required), the support region must have a peripheral portion (around the die) of considerable dimensions. For example, at present it is required that the support region has a free wire-soldering area having a width (i.e., distance between the edge of the die and the edge of the support region) of at least 300 $\mu m$ for each side on which a connection wire is to be bonded.

It follows that an electrical connection using the wire-bonding technique for power devices of the type specified above entails high encumbrance which is in conflict with the demand for ever smaller packages. In addition, the high number of required connection wires causes a high parasitic inductance and reduces the performance of the device.

SUMMARY OF THE INVENTION

The aim of the present invention is to provide an improved electric connection structure.

According to the present invention, an electronic device and a relative method of connection are described as follows:

On a semiconductor material body housing an electronic device a peripheral region of semiconductor material and at least one pad are initially formed. The peripheral region is connected to a first terminal of the electronic device and extends on at least one peripheral portion of the semiconductor material body. The pad is insulated from the semiconductor material body and is electrically connected to a second terminal of the electronic device. The semiconductor material body is fixed to a support body formed on a blank belonging to a reel. The pad is connected by a wire to an electrode formed by the blank. Next, a connection region is formed, by galvanic growth, on the peripheral region, and surrounds, at least partially, the semiconductor material body and the support body, effecting an electrical connection between the peripheral region of the semiconductor material body and the support body. The connecting wire and electrode are surrounded by the same galvanic growth, resulting in an increase in the diameter of the wire. The device is then encapsulated according to known processes, and the blank is cut to obtain the finished product.

BRIEF DESCRIPTION OF THE DRAWINGS

For a better understanding of the present invention, a preferred embodiment thereof is now described, merely to provide a non-limiting example, with reference to the attached drawings, wherein:

FIGS. 2–4 are cross sections of the blank and of the die of FIG. 1, taken along cross-section line II—II, in subsequent manufacture steps.

DETAILED DESCRIPTION OF THE INVENTION

Figure 1:
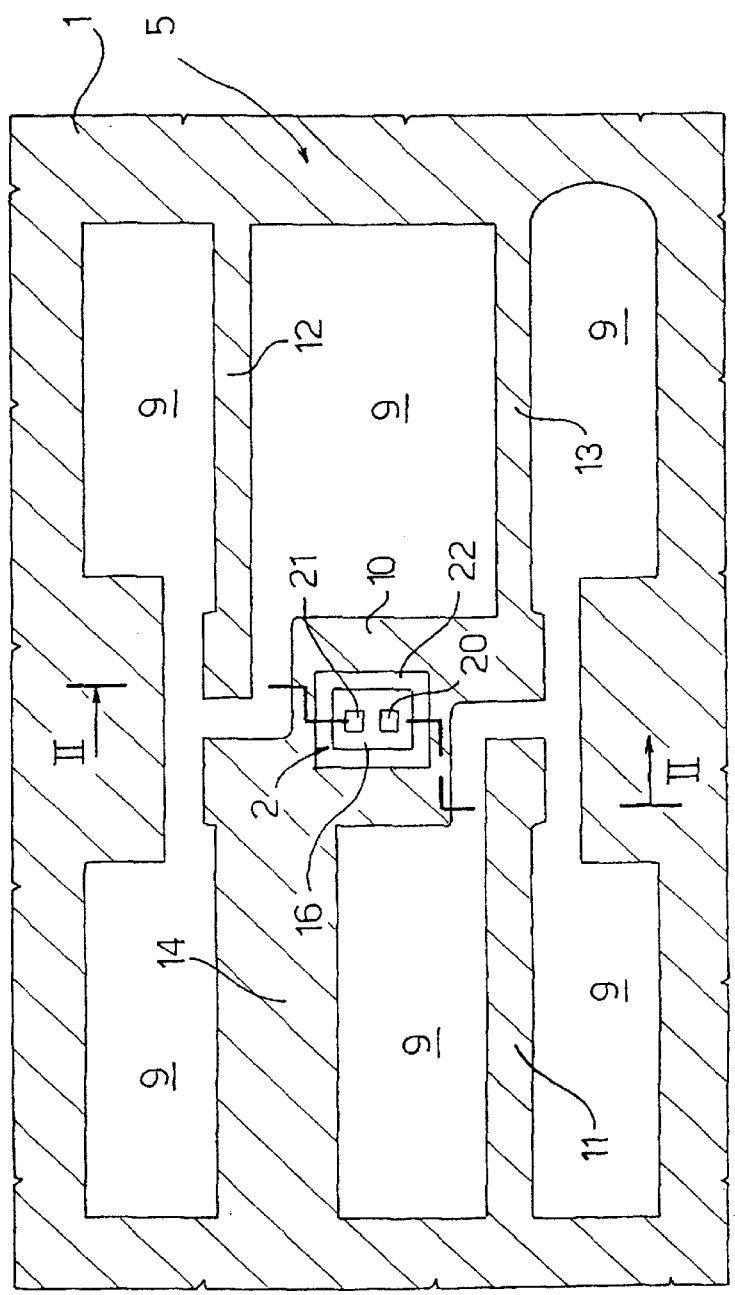
FIG. 1 is a top view of a die bonded to a blank.
Figure 2:
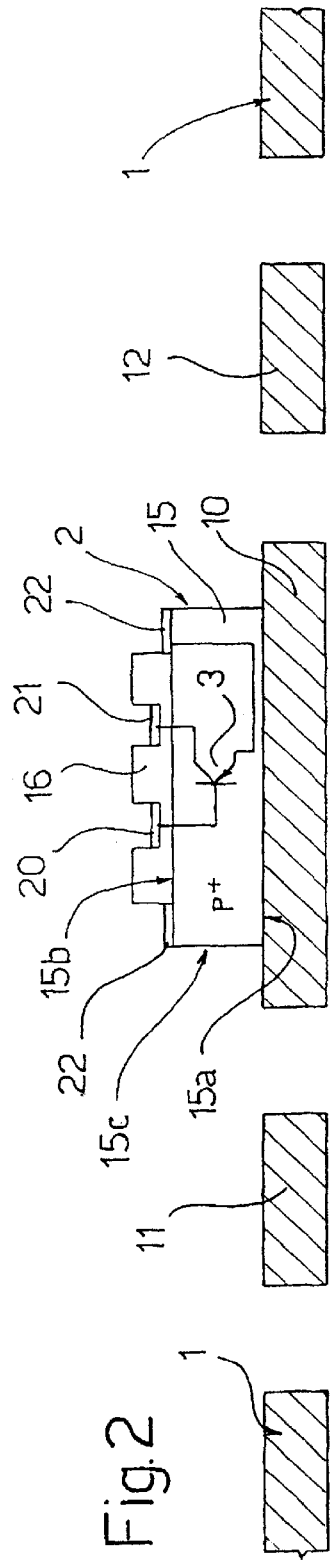

FIGS. 1 and 2 show a portion of a sheet tape 1 (hereinafter referred to as "reel"), on which a die 2 is already bonded, the die being designed to house a power device of the bottom-collector, bottom-base, bottom-emitter, bottom-drain, bottom-source, or bottom-gate type. In particular, in the example shown the die 2 houses a bipolar gain transistor 3 (represented with its equivalent electric circuit in FIG. 2), of the high-frequency, high-power, and bottom-emitter type.

In a per se known manner, the reel 1 defines a plurality of blanks 5 identical to the one shown in FIG. 1, one for each die 2, the geometry of which (after the electric connection, the formation of an encapsulation package, and cutting of the reel 1) is designed to form a support region for the die, as well as electrodes or pins. In detail, the blank 5 of FIG. 1 comprises a support region 10, arranged at the center, and four electrodes 11, 12, 13, 14 laterally delimited by empty areas 9.

In the example illustrated, two electrodes 11, 12, arranged diagonally opposite to one another with respect to the support region 10, are separate from the support region 10 and from one another, and are joined to the reel 1 only at external portions of the blank 5. The electrodes 13, 14, which also extend diagonally opposite to one another from the support region 10, are connected to the support region 10, and are hence at the same potential. In the example illustrated, the electrode 11 is intended to be connected to a base region, the electrode 12 is intended to be connected to a collector region, and the electrodes 13, 14 are intended to be connected to the emitter region, which is in turn appropriately biased, for example grounded.

The die 2 comprises a body 15 of $P^+$-type semiconductor material, integrating the bipolar gain transistor 3. The body 15 has a first face 15a fixed to the support region 10, a second face 15b opposite to the first face, and a side surface 15c. Typically, the body 15 has low resistivity, for instance 10–20 mΩ/cm. A passivation layer 16 extends over the second face 15b of the body 15. The passivation layer 16 is open at two pads, or terminals, 20, 21, which are electrically connected, in a known way that is not illustrated, respectively to the base region and collector region of the bipolar gain transistor 3. In addition, the passivation layer 16 is removed at the front outer perimeter of the die 2 and leaves uncovered a metal strip 22, which extends directly on the second face 15b of the body 15, or is anyway electrically connected to the body 15, forming, thereby, an additional terminal. The metal strip 22, for example made of an aluminum and/or gold alloy, like the pads 20, 21, and having, for example, a width of 20 μm and a depth of 3 μm, preferably extends along the entire perimeter of the second face 15b of the body 15, as may be seen in particular in the top view of FIG. 1.

The method of connection comprises initially forming the metal strip 22 and the pads 20, 21, preferably simultaneously. Next, the die 2 is bonded on the support region 10, according to known techniques, and the pads 20, 21 are electrically connected to the respective electrodes 11, 12, through connection wires 24, in a known way (wire-bonding step). The structure shown in FIG. 3 is thus obtained.

Subsequently, the reel 1 is immersed in a galvanic bath and connected to the anode or to the cathode of the latter. In this way, on all the electrically conductive parts in contact with the reel 1, a conductive layer 25 of metallic material grows isotropically. The metallic material is preferably chosen from among the group comprising gold, copper, lead, tin, and nickel, or is a lead-tin alloy. The thickness of the conductive layer 25 depends upon the application requirements (typically upon the current flowing and the impedance desired at the envisaged operating frequency) and may, for instance, be 10 μm. The conductive layer 25 grows on the whole reel 1, so as to coat the electrodes 11–14 (only the electrodes 11, 12 may be seen in FIG. 4), on the connection wires 24, which become thicker, around the support region 10 (where the latter is uncovered), on the side surface 15c of the body 15, and on the metal strip 22.

In particular, a portion 25a of the conductive layer 25 electrically connects the metal strip 22, and thus the emitter region of the bipolar gain transistor 3, to the support region 10, thus electrically connecting the emitter region to the potential of the surface 15a of the body 15. This connection is possible thanks to the low conductivity of the body 15, whose side surface 15c is also covered by the growing portion 25a of the conductive layer 25. The structure shown in FIG. 4 is thus obtained.

Thereby, the base region and collector region of the bipolar gain transistor 3 are connected to their respective electrodes 11, 12 in a standard way, via the connection wires 24, and the emitter region is connected to ground and to the electrodes 13, 14 via the portion 25a of the conductive layer 25.

Next, the normal final steps of package molding and cutting the reel 1 are carried out to obtain the finished devices.

The advantages of the described connection system are the following. In the first place, the electronic device has a much smaller size than known devices with equal performance. In fact, the area necessary on the top side of the die 2 for forming the pads is reduced, considering that, for wires having a diameter of 25.6 μm a soldering area of 60×60 μm$^2$ is required, and that two adjacent connection wires must be positioned at least 150 μm apart for avoiding mutual inductance.

In addition, the support region 10 does not have to be sized so as to enable soldering of the wires, but can be chosen to be just slightly larger than the die 2.

The electronic device thus obtained has high performance. In fact, the portion 25a of the conductive layer 25 represents a considerable metallic mass that is able to carry a high current (the metallic mass of the portion 25a is proportional to the size of the die 2, as well as to the thickness of the conductive layer 25; consequently, with a 110 μm thick conductive layer 25, a 50.6-μm section of side surface 15c of the body 15 is equivalent to a wire having a diameter of 25.6 μm).

In addition, the growth of the conductive layer 25 brings about a thickening of the connection wires 24; consequently, their parasitic resistance and inductance are reduced. At the end of the process, connection wires 24 are thus obtained having a diameter such as ones normally requiring much larger pads.

The replacement of some wires with the portion 25a of the conductive layer 25 allows a further increase in the performance of the electronic device, given the lower parasitic inductance of said device.

The growth of the conductive layer 25 is carried out simultaneously for all the blanks 5 of a reel 1, thus obtaining simultaneous connection between all the metal strips 22 and their respective support regions 10 and dispensing with numerous soldering operations for separate connection by one or more wires.

Finally, it is clear that numerous modifications and variations may be made to the connection structure and to the electrical method of connection described and illustrated herein, all falling within the scope of the invention, as defined in the attached claims. In particular, the present method is applicable to all devices having a terminal connected to the bottom area of the body 15, including integrated, as well as discrete, circuits. Furthermore, the metal strip 22 may also be discontinuous and not extend over the entire periphery of the die 2, when it is not necessary to exploit the entire lateral surface of the die 2 for the connection.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electronic device comprising:
   a semiconductor material body, having a peripheral region of conductive material;
   a support body of conductive material, affixed to said semiconductor material body;
   a first terminal, connected to said peripheral region of conductive material; and a conductive connection region extending on said peripheral region and said first terminal and surrounding at least partially said semiconductor material body and said support body.

2. The device of claim 1, wherein said semiconductor material body has a first face fixed to said support body and a second face opposite to said first face, and in that said peripheral region extends on the periphery of said second face.

3. The device of claim 2, wherein said peripheral region extends along the entire periphery of said second face, and said connection region extends completely on a lateral surface of said semiconductor material body.

4. The device according to claim 1, wherein said peripheral region and said connection region are made of a metallic material.

5. The device according to claim 1, further comprising a second terminal connected to a respective electrode via a pad and a conductive wire, and in that at least one metallic region surrounds said electrode, said conductive wire and said pad.

6. The device of claim 5, wherein said peripheral region, said connection region, and said metallic region are made of a metal chosen from among a group comprising gold, copper, lead, tin, and nickel and a lead-tin alloy.

7. A method for connecting a semiconductor material body to a reel, said semiconductor material body housing an electronic device having a first terminal, and said reel comprising a blank forming a support body and a first electrode, the method comprising the steps of:

forming a peripheral region of conductive material connected to said first terminal and extending over at least one peripheral portion of said semiconductor material body;

fixing said semiconductor material body to said support body; and forming a conductive connection region extending over said peripheral region and surrounding at least partially said semiconductor material body and said support body.

8. The method of claim 7, wherein the step of forming said peripheral region further comprises the step of forming, on said semiconductor material body, at least one pad insulated from said semiconductor material body and electrically connected to a second terminal of said electronic device, and in that, prior to said step of forming a connection region, the step is carried out of fixing at least one conductive wire between said pad and said first electrode.

9. The method of claim 7, wherein said semiconductor material body has a first face fixed to said support body and a second face opposite to said first face, and in that said peripheral region extends over the entire periphery of said second face.

10. The method of claim 9, wherein said peripheral region extends along the entire periphery of said second face, and said connection region extends completely on a lateral surface of said semiconductor material body.

11. The method according to claim 7, wherein said step of forming a connection region is carried out by galvanic growth of metallic material on said reel.

12. A device comprising:

a semiconductor material body having a top surface and a bottom surface;

a first terminal located on said top surface;

a second terminal located on a periphery of said top surface;

a conductive support structure affixed to the bottom surface of said semiconductor material body;

an electrode;

a conductive wire attached at a first end to said first terminal, and at a second end to said electrode;

a first metallic region, at least partially surrounding said wire, said electrode and said first terminal; and a second metallic region at least partially surrounding said semiconductor material body and said conductive support structure, and making electrical contact with said conductive support structure and said second terminal.

13. The device according to claim 12, wherein said semiconductor material body comprises an integrated circuit.

14. The device according to claim 12, wherein said conductive support structure comprises a second electrode.

15. The device according to claim 12, wherein said first metallic region and said second metallic region are formed simultaneously.

16. The device according to claim 12, further comprising:

an additional terminal, located on said top surface;

an additional electrode;

an additional conductive wire, having a first and a second end, wherein said first end of the additional conductive wire is affixed to said additional terminal, and said second end of the additional conductive wire is affixed to said additional electrode;

a third metallic region, at least partially surrounding said additional conductive wire, said additional electrode and said additional terminal.

17. A method comprising:

forming a semiconductor material body;

forming a first terminal on a top surface of said semiconductor material body;

forming a second terminal on a periphery of the top surface of said semiconductor material body;

affixing a conductive support structure to a bottom surface of said semiconductor material body;

affixing a first end of a conductive wire to said first terminal;

affixing a second end of the conductive wire to an electrode;

forming a first metallic layer covering, at least partially, said conductive wire, said electrode, and said first terminal; and forming a second metallic layer covering, at least partially, said conductive support structure, said semiconductor material body, and said second terminal, and connecting, electrically, said conductive support structure and said second terminal.

18. The method according to claim 17, wherein the step of forming the semiconductor material body comprises the step of forming an electronic circuit within said semiconductor material body.

19. The method according to claim 18, wherein the first and second terminals are in electrical contact with features of said electronic circuit.

20. The method according to claim 17, wherein the steps of forming said first and said second metallic layers are performed simultaneously, by galvanic growth.

21. The method according to claim 20, wherein said conductive support structure and said electrode are formed simultaneously.

22. The method according to claim 21, wherein said conductive support structure and said electrode are parts of a single conductive substrate.

23. The method according to claim 22, further comprising the step of cutting the single conductive substrate to isolate the conductive support structure and the electrode.

24. The method according to claim 17, wherein said step of forming said first terminal comprises the step of forming an additional terminal, and said step of forming said electrode comprises the step of forming an additional electrode, and the step of affixing said conductive wire to said first terminal and said electrode comprises the step of affixing a first end of an additional wire to said additional terminal and affixing a second end of said additional wire to said additional electrode.

25. The method according to claim 24, wherein the step of forming said first metallic layer comprises the step of forming an additional metallic layer covering, at least partially, said additional conductive wire, said additional electrode and said additional terminal.

26. A device comprising:

a semiconductor material body having a top surface and a bottom surface;

a terminal located on a periphery of said top surface;

a conductive support structure affixed to the bottom surface of said semiconductor material body; and a metallic region at least partially surrounding said semiconductor material body and said conductive support structure, and making electrical contact with said conductive support structure and said terminal.

27. A method comprising:

forming a semiconductor material body;

forming a terminal on a periphery of the top surface of said semiconductor material body;

affixing a conductive support structure to a bottom surface of said semiconductor material body; and forming a metallic layer covering, at least partially, said conductive support structure, said semiconductor material body, and said second terminal, and connecting, electrically, said conductive support structure and said second terminal.

* * * * *